US009406444B2

(12) United States Patent  
Oakes et al.

(10) Patent No.: US 9,406,444 B2  
(45) Date of Patent: Aug. 2, 2016

(54) THIN FILM CAPACITORS

(75) Inventors: James Oakes, Westford, MA (US); James Martin, Londonberry, NH (US); Edward Provo Wallis Horne, Burlington (CA); William E. McKinzie, Fulton, MD (US)

(73) Assignee: BLACKBERRY LIMITED, Ontario (CA)

( * ) Notice: Subject to any disclaimer, the term of this patent is extended or adjusted under 35 U.S.C. 154(b) by 524 days.

(21) Appl. No.: 13/289,194

(22) Filed: Nov. 4, 2011

(65) Prior Publication Data

US 2012/0154975 A1 Jun. 21, 2012

Related U.S. Application Data

(60) Continuation-in-part of application No. 11/602,114, filed on Nov. 20, 2006, now Pat. No. 8,064,188, and a continuation-in-part of application No. 12/321,897, filed on Jan. 27, 2009, now Pat. No. 8,627,556, which is a division of application No. 11/598,354, filed on Nov. 13, 2006, now Pat. No. 7,869,186.

(60) Provisional application No. 60/736,366, filed on Nov. 14, 2005.

(51) Int. Cl.
| | |
|---|---|
| *H01G 4/005* | (2006.01) |
| *H01G 4/38* | (2006.01) |
| *H01G 4/33* | (2006.01) |
| *H01G 7/06* | (2006.01) |
| *H04B 1/04* | (2006.01) |
| *H03H 1/00* | (2006.01) |

(52) U.S. Cl.
CPC . *H01G 4/38* (2013.01); *H01G 4/33* (2013.01); *H01G 7/06* (2013.01); *H04B 1/0458* (2013.01); *H03H 2001/0014* (2013.01)

(58) Field of Classification Search
USPC ........ 361/303, 301.4, 328–330; 257/307, 309
See application file for complete search history.

(56) References Cited

U.S. PATENT DOCUMENTS

| 2,745,067 A | 5/1956 | True |
| 3,117,279 A | 1/1964 | Ludvigson |

(Continued)

FOREIGN PATENT DOCUMENTS

| DE | 19614655 | 10/1997 |
| EP | 0685936 | 6/1995 |

(Continued)

OTHER PUBLICATIONS

Hyun, S., "Effects of strain on the dielectric properties of tunable dielectric SrTi03 thin films", Applied Physics Letters, 2004 American Institute of Physics.

(Continued)

*Primary Examiner* — Eric Thomas  
(74) *Attorney, Agent, or Firm* — Gustin & Gust, PLC; Joseph Hrutka

(57) ABSTRACT

A system that incorporates teachings of the present disclosure may include, for example, a first solid electrode, a second electrode separated into subsections, and a dielectric medium separating the subsections from the first solid electrode, where the subsections of the second electrode include a first group of subsections and a second group of subsections, where the first group of subsections are connectable with a first terminal for receiving an input signal, and where the second group of subsections is connectable with a second terminal for providing an output signal. Other embodiments are disclosed.

14 Claims, 9 Drawing Sheets

(56) References Cited

U.S. PATENT DOCUMENTS

| | | |
|---|---|---|
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,742,279 A | 6/1973 | Kupsky |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,777,490 A | 10/1988 | Sharma |
| 4,799,066 A | 1/1989 | Deacon |
| 4,965,607 A | 10/1990 | Wilkins |
| 5,032,805 A | 7/1991 | Elmer |
| 5,136,478 A | 8/1992 | Bruder |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,561,407 A | 10/1996 | Koscica |
| 5,564,086 A | 10/1996 | Cygan |
| 5,583,359 A * | 12/1996 | Ng et al. ................. 257/306 |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,721,194 A | 2/1998 | Yandrofski |
| 5,766,697 A | 6/1998 | Sengupta |
| 5,777,581 A | 7/1998 | Lilly |
| 5,778,308 A | 7/1998 | Sroka |
| 5,786,727 A | 7/1998 | Sigmon |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,929,717 A | 7/1999 | Richardson |
| 5,963,871 A | 10/1999 | Zhinong |
| 5,969,582 A | 10/1999 | Boesch |
| 5,982,099 A | 11/1999 | Barnes et al. |
| 5,990,766 A | 11/1999 | Zhang |
| 6,009,124 A | 12/1999 | Smith |
| 6,020,787 A | 2/2000 | Kim |
| 6,029,075 A | 2/2000 | Das |
| 6,045,932 A | 4/2000 | Jia |
| 6,061,025 A | 5/2000 | Jackson |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,133,883 A | 10/2000 | Munson |
| 6,172,385 B1 | 1/2001 | Duncombe |
| 6,215,644 B1 | 4/2001 | Dhuler |
| 6,281,847 B1 | 8/2001 | Lee |
| 6,309,895 B1 | 10/2001 | Jaing |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,570,462 B2 | 5/2003 | Edmonson |
| 6,590,468 B2 | 7/2003 | du Toit |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,657,595 B1 | 12/2003 | Phillips |
| 6,661,638 B2 | 12/2003 | Jackson |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,759,918 B2 | 7/2004 | Du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,875,655 B2 | 4/2005 | Lin |
| 6,888,714 B2 | 5/2005 | Shaw |
| 6,905,989 B2 | 6/2005 | Ellis |
| 6,907,234 B2 | 6/2005 | Karr |
| 6,920,315 B1 | 7/2005 | Wilcox |
| 6,922,330 B2 | 7/2005 | Nielsen |
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,993,297 B2 | 1/2006 | Smith |
| 6,999,297 B1 | 2/2006 | Klee |
| 7,009,455 B2 | 3/2006 | Toncich |
| 7,071,776 B2 | 7/2006 | Forrester |

(56) References Cited

U.S. PATENT DOCUMENTS

| | | | |
|---|---|---|---|
| 7,107,033 B2 | 9/2006 | du Toit | |
| 7,113,614 B2 | 9/2006 | Rhoads | |
| 7,151,411 B2 | 12/2006 | Martin | |
| 7,176,634 B2 | 2/2007 | Kitamura | |
| 7,176,845 B2 | 2/2007 | Fabrega-Sanchez | |
| 7,180,467 B2 | 2/2007 | Fabrega-Sanchez | |
| 7,221,327 B2 | 5/2007 | Toncich | |
| 7,312,118 B2 | 12/2007 | Kiyotoshi | |
| 7,332,980 B2 | 2/2008 | Zhu | |
| 7,332,981 B2 | 2/2008 | Matsuno | |
| 7,339,527 B2 | 3/2008 | Sager | |
| 7,426,373 B2 | 9/2008 | Clingman | |
| 7,468,638 B1 | 12/2008 | Tsai | |
| 7,531,011 B2 | 5/2009 | Yamasaki | |
| 7,535,312 B2 | 5/2009 | McKinzie | |
| 7,539,527 B2 | 5/2009 | Jang | |
| 7,557,507 B2 | 7/2009 | Wu | |
| 7,596,357 B2 | 9/2009 | Nakamata | |
| 7,655,530 B2 | 2/2010 | Hosking | |
| 7,667,663 B2 | 2/2010 | Hsiao | |
| 7,711,337 B2 | 5/2010 | McKinzie | |
| 7,714,678 B2 | 5/2010 | du Toit | |
| 7,728,693 B2 | 6/2010 | du Toit | |
| 7,795,990 B2 | 9/2010 | du Toit | |
| 7,852,170 B2 | 12/2010 | McKinzie | |
| 7,865,154 B2 | 1/2011 | Mendolia | |
| 7,969,257 B2 | 6/2011 | du Toit | |
| 8,213,886 B2 | 7/2012 | Blin | |
| 2002/0047154 A1* | 4/2002 | Sowlati | H01L 27/0688 257/307 |
| 2002/0191703 A1 | 12/2002 | Ling | |
| 2002/0193088 A1 | 12/2002 | Jung | |
| 2003/0060227 A1 | 3/2003 | Sekine | |
| 2003/0071300 A1 | 4/2003 | Yashima | |
| 2003/0114124 A1 | 6/2003 | Higuchi | |
| 2003/0193997 A1 | 10/2003 | Dent | |
| 2003/0232607 A1 | 12/2003 | Le Bars | |
| 2004/0009754 A1 | 1/2004 | Smith | |
| 2004/0137950 A1 | 7/2004 | Bolin | |
| 2004/0202399 A1 | 10/2004 | Kochergin | |
| 2004/0257293 A1 | 12/2004 | Friedrich | |
| 2005/0032488 A1 | 2/2005 | Pehlke | |
| 2005/0042994 A1 | 2/2005 | Otaka | |
| 2005/0059362 A1 | 3/2005 | Kalajo | |
| 2005/0082636 A1 | 4/2005 | Yashima | |
| 2005/0093624 A1 | 5/2005 | Forrester et al. | |
| 2005/0130608 A1 | 6/2005 | Forse | |
| 2005/0145987 A1* | 7/2005 | Okuda et al. | 257/532 |
| 2005/0215204 A1 | 9/2005 | Wallace | |
| 2005/0282503 A1 | 12/2005 | Onno | |
| 2006/0003537 A1 | 1/2006 | Sinha | |
| 2006/0009165 A1 | 1/2006 | Alles | |
| 2006/0160501 A1 | 7/2006 | Mendolia | |
| 2006/0183433 A1 | 8/2006 | Mori | |
| 2006/0183442 A1 | 8/2006 | Chang et al. | |
| 2006/0281423 A1 | 12/2006 | Caimi | |
| 2007/0013483 A1 | 1/2007 | Stewart | |
| 2007/0042734 A1 | 2/2007 | Ryu | |
| 2007/0080888 A1 | 4/2007 | Mohamadi | |
| 2007/0085609 A1 | 4/2007 | Itkin | |
| 2007/0109716 A1 | 5/2007 | Martin et al. | |
| 2007/0142014 A1 | 6/2007 | Wilcox | |
| 2007/0149146 A1 | 6/2007 | Hwang | |
| 2007/0197180 A1 | 8/2007 | McKinzie et al. | |
| 2007/0200766 A1 | 8/2007 | McKinzie | |
| 2007/0285326 A1 | 12/2007 | McKinzie | |
| 2008/0055016 A1 | 3/2008 | Morris | |
| 2008/0122553 A1 | 5/2008 | McKinzie | |
| 2008/0122723 A1 | 5/2008 | Rofougaran | |
| 2008/0158076 A1 | 7/2008 | Walley | |
| 2009/0109880 A1 | 4/2009 | Kim | |
| 2009/0149136 A1 | 6/2009 | Rofougaran | |
| 2010/0085260 A1 | 4/2010 | McKinzie | |
| 2010/0156552 A1 | 6/2010 | McKinzie | |
| 2012/0154975 A1 | 6/2012 | Oakes | |

FOREIGN PATENT DOCUMENTS

| | | |
|---|---|---|
| EP | 0909024 | 4/1999 |
| EP | 1137192 | 9/2001 |
| EP | 1298810 | 4/2006 |
| JP | 03276901 | 3/1990 |
| JP | 10209722 | 8/1998 |
| JP | 2000124066 | 4/2000 |
| KR | 2002052476 A * | 7/2002 |

OTHER PUBLICATIONS

Ida, I. et al., "An Adaptive Impedance Matching System and Its Application to Mobile Antennas", TENCON 2004, IEEE Region 10 Conference, See Abstract ad p. 544, Nov. 21-24, 2004, 543-547.

Patent Cooperation Treaty, "International Search Report and Written Opinion", International Application No. PCT/US2010/046241, Mar. 2, 2011.

Patent Cooperation Treaty, "International Search Report and Written Opinion", International Application No. PCT/US2010/056413, Jul. 27, 2011.

Patent Cooperation Treaty, "International Search Report and Written Opinion", PCT Application No. PCT/US08/005085, Jul. 2, 2008.

Pervez, N.K., "High Tunability barium strontium titanate thin films for RF circuit applications", Applied Physics Letters, 2004 American Institute of Physics.

Qiao, et al., "Antenna Impedance Mismatch Measurement and Correction for Adaptive COMA Transceivers", IEEE, 2005.

Qiao, et al., "Measurement of Antenna Load Impedance for Power Amplifiers", The Department of Electrical and Computer Engineering, University of California, San Diego, Sep. 13, 2004.

Stemmer, Susanne, "Low-loss tunable capacitors fabricated directly on gold bottom electrodes", University of California Postprints 2006.

Taylor, T.R., "Impact of thermal strain on the dielectric constant of sputtered barium strontium titanate thin films", Applied Physics Letters, 2002 American Institute of Physics.

Tombak, Ali, "Tunable Barium Strontium Titanate Thin Film Capacitors for RF and Microwave Applications", IEEE Microwave and Wireles Components Letters, vol. Jan. 12, 2002, p. 3.

Xu, Hongtao, "Tunable Microwave Integrated Circuits using BST Thin Film Capacitors with Device", Integrated Ferroelectrics, Department of Electrical Engineering and Computer Engineering, University of California, 2005.

* cited by examiner

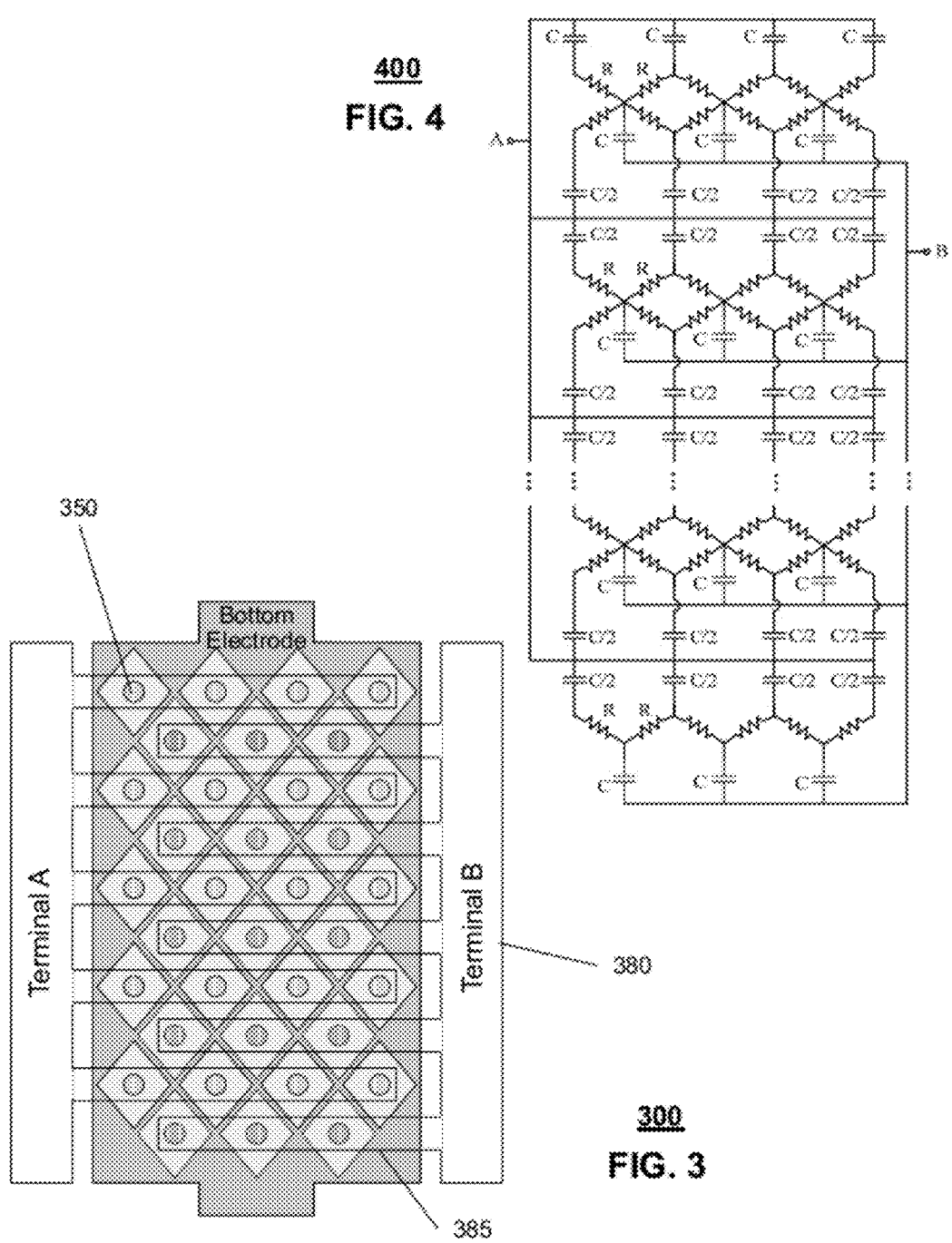

700

800

THIN FILM CAPACITORS

CROSS REFERENCE TO RELATED APPLICATIONS

This application is a continuation-in-part of U.S. application Ser. No. 11/602,114 filed on Nov. 20, 2006 now U.S. Pat. No. 8,064,188. The disclosures of this applications is hereby incorporated by reference herein in its entirety. This application is also a continuation-in-part of U.S. application Ser. No. 12/321,897 filed Jan. 27, 2009, which was a divisional of U.S. application Ser. No. 11/598,354 filed on Nov. 13, 2006 now U.S. Pat. No. 7,869,186, which claimed priority to U.S. provisional application No. 60/736,366 filed Nov. 14, 2005. The disclosures of each of these applications are hereby incorporated by reference herein in their entirety.

FIELD OF THE DISCLOSURE

The present disclosure relates generally to electrical components and more particularly to capacitors.

BACKGROUND

Some capacitors are made with dielectric material sandwiched between a top and a bottom electrode in an integrated parallel-plate overlay capacitor structure. In such a structure, the bottom electrode thickness can be constrained by the dielectric thickness. The losses in the thin bottom electrodes can limit the overall high frequency quality factor of such capacitors. Additionally, the higher electrical field between the top and bottom electrodes at the edge of the crossover can create premature breakdown under the application of high bias voltages or large AC signals to the capacitor. As the frequency increases, electromagnetic waves travel towards the surface of the circuits, making the surface properties, deposition techniques and design critical. As the surface wave velocity propagates throughout the surface of the capacitor, the waves can be slowed due to the field shortening effect. The degree of the effect is typically dependent on the geometry and pattern of the top metallization.

In a standard 0603 surface mount package, the size of active area of the capacitor is just 150 micrometers square. An 0201 surface mount package would be 250 micrometers by 500 micrometers and a wire bonded package using this technology would be as small as 60 micrometers by 60 micrometers.

BRIEF DESCRIPTION OF THE DRAWINGS

FIG. 3 depicts another exemplary embodiment of a stack of a thin film diamond shaped deposited electrode terminals and tunable dielectric materials on a substrate.

FIG. 4 depicts a circuit representative of the exemplary embodiment of FIG. 3.

DETAILED DESCRIPTION

Figure 1:
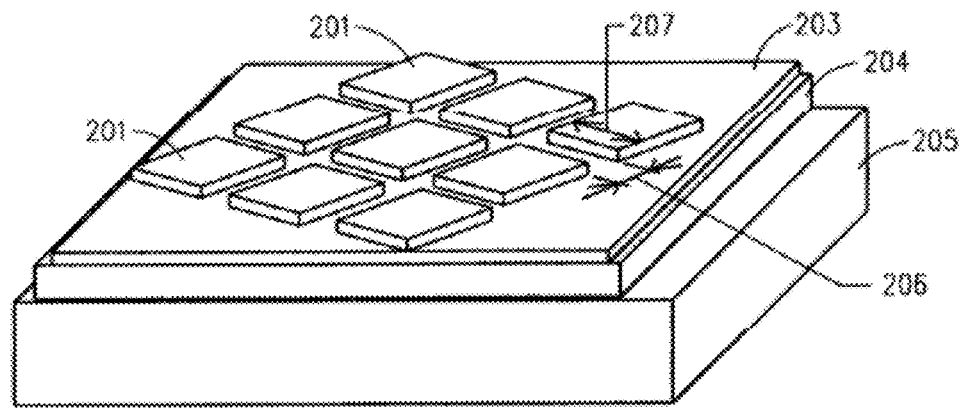
FIG. 1 depicts an exemplary embodiment of a stack of a thin film diamond shaped deposited electrode terminals and tunable dielectric materials on a substrate.

The present disclosure describes, among other things, illustrative embodiments of systems and methods for providing tunable capacitors, such as BST thin film capacitors, where there is reduced contact with the bottom electrodes and which creates an improved periphery with an improved quality (Q) factor and a desired aspect ratio range.

One embodiment of the present disclosure can include an apparatus having a first solid electrode, a second electrode separated into subsections, and a dielectric medium separating the subsections from the first solid electrode. The subsections of the second electrode can include a first group of subsections and a second group of subsections. The first group of subsections and the first solid electrode can form a first group of capacitors. The second group of subsections and the first solid electrode can form a second group of capacitors. Each capacitor of the first group of capacitors can be in parallel. Each capacitor of the second group of capacitors can be in parallel. The first group of capacitors can be in series with the second group of capacitors. The first group of subsections can be connectable with a first terminal for receiving an input signal. The second group of subsections can be connectable with a second terminal for providing an output signal.

One embodiment of the present disclosure can include an apparatus having a first solid electrode, a second electrode separated into subsections, and a dielectric medium separating the subsections from the first solid electrode. The subsections of the second electrode can include a first group of subsections and a second group of subsections. The first group of subsections can be connectable with a first terminal for receiving an input signal. The second group of subsections can be connectable with a second terminal for providing an output signal.

One embodiment of the present disclosure can include an apparatus having a first structure and a second structure. The first structure can include a plurality of first top electrodes, a plurality of first middle electrodes, a plurality of first bottom electrodes and a tunable dielectric medium. The tunable dielectric medium can separate the plurality of first top electrodes from the plurality of first middle electrodes to form first upper capacitors. The tunable dielectric medium can separate the plurality of first bottom electrodes from the plurality of first middle electrodes to form first lower capacitors. The first upper and lower capacitors can form a first stacked capacitor structure. The second structure can include a plurality of second top electrodes, a plurality of second middle electrodes, a plurality of second bottom electrodes and the tunable dielectric medium. The tunable dielectric medium can separate the plurality of second top electrodes from the plurality of second middle electrodes to form second upper capacitors. The tunable dielectric medium can separate the plurality of second bottom electrodes from the plurality of second middle electrodes to form second lower capacitors. The second upper and lower capacitors can form a second stacked capacitor structure. The first and second structures can share at least one electrode to provide electrical contact between the first and second structures. The plurality of first middle electrodes of the first structure can be connectable with a first bias terminal for receiving a first bias signal. The plurality of second middle electrodes of the second structure can be connectable with a second bias terminal for receiving a second bias signal.

In one or more exemplary embodiments, a capacitor is provided that comprises a substrate, a first solid electrode disposed on the substrate, and a second electrode broken into subsections. The subsections can be connected by a bus line and separated from the first electrode by a dielectric medium. The second electrode broken into subsections may have a lower resistance than the first solid electrode. By changing the width and length of the sides of the subsections, the resistance of the first electrode is modifiable.

In one or more exemplary embodiments, a BST thin film design structure is provided that optimizes electrode structure to enable very high "Q" (low resistance) capacitors through use of a process that varies the width/length aspect ratio of the electrode(s). One of the exemplary embodiments can utilize various capacitor materials where one electrode(s) is made from a higher resistance metal(s) than the opposite electrode(s). In one or more embodiments, one electrode may be thinner than the other electrode, and can exhibit a higher resistance. In one or more embodiments, capacitors with such material properties can be used in planar integrated capacitors, as well as discrete ceramic capacitors. One or more of the exemplary embodiments can reduce the mechanical stresses generated in the metals and/or dielectric films of the capacitor.

It should be understood to a person skilled in the art that "high frequency" refers to the radio spectrum between 3 MHZ to 30 GHz, which includes both the "RF" spectrum and the "microwave spectrum". It shall be further understood that a "device" can include multiple "components", which can be "passive components" and/or "active components" and a "3D" device may comprise multiple layers stacked, such as vertically.

Creep is the term given to the material deformation that occurs as a result of long term exposure to levels of stress that are below the yield or ultimate strength. The rate of this damage is a function of the material properties, the exposure time, exposure temperature and the applied load (stress). Creep is usually experienced when the device is heated and cooled as a function of use or environmental temperature fluctuations. Such failures may be caused either by direct thermal loads or by electrical resistive loads, which in turn generate excessive localized thermal stresses. Depending on the magnitude of the applied stress and its duration, the deformation may become so large that it will experience brittle and/or ductile fracture, interfacial separation and creep rupture.

One or more of the exemplary embodiments can include at least one electrode structure that allows for the creation of very high "Q" (low resistance) capacitors which is well suited to common capacitor material structures where at least one electrode is made from a higher resistance metal or a thinner metal layer than the opposite electrode. High resistance electrodes can include but are not limited to Tungsten, Platinum, Rhodium, Chrome, Titanium/Tungsten, Nickel composites, and combinations thereof. Exemplary capacitors with such material properties can be utilized in planar integrated capacitors, as well as discrete ceramic capacitors. One or more of the exemplary embodiments can reduce the mechanical stresses, creep and/or other thermal generated stresses in the metals and dielectric films of the capacitor. In a broken or segmented electrode configuration of the exemplary embodiments, the broken electrode usually carries the lower resistance of the two. The broken electrode can distribute the signal across the capacitor area and, through proper arrangement, increase the effective width of the signal path through the higher resistance solid electrode. The signal busses (e.g., electrical metal connections) can be utilized for bringing in and taking out the signal. One or more of the exemplary embodiments can include at least a broken electrode and bussing, where the broken electrode can be used in various types of capacitors, and may find applicability in other components, such as transistor structures. One or more of the exemplary embodiments can realize these benefits by breaking at least two of the electrodes of a pair of series capacitors into subsections.

Figure 2:
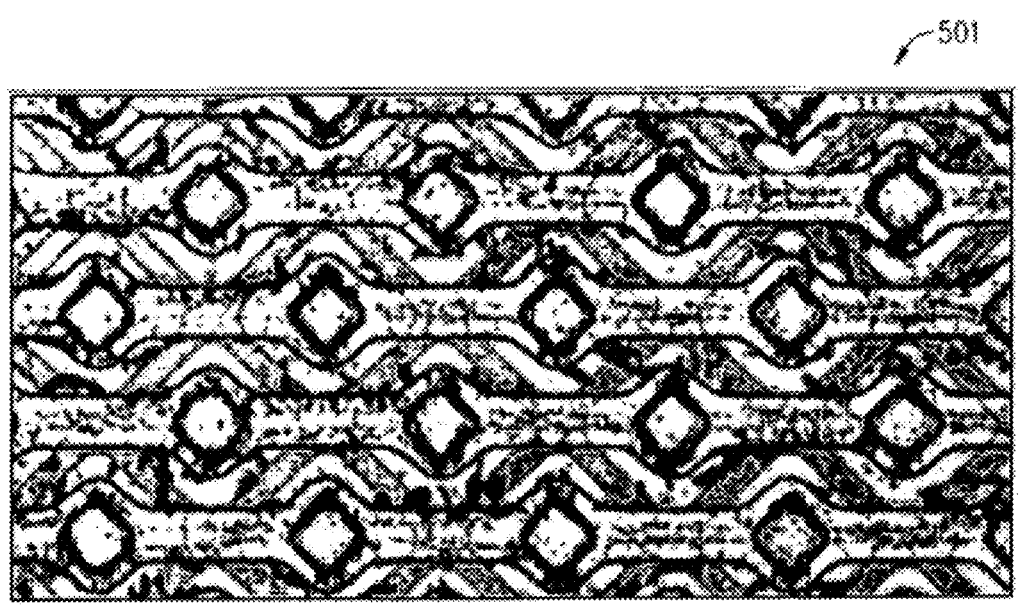
FIG. 2 depicts a micro-image of the top of two series capacitors as described in FIG. 1.

Referring to FIG. 1, a capacitor is shown having diamond-like shaped top electrode subsections 201 and a bottom electrode 204 with a substrate 205. Dielectric material 203 (e.g., a tunable dielectric such as BST material) can be sandwiched between the top and bottom electrodes 201, 204. By varying or otherwise selecting the Width (W) 207 and Length (L) 206 aspect ratio of the aperture between the electrodes in the active area, an optimized Q value can be achieved. The subsections of the top electrode 201 can be arranged to increase the effective Width 207 of the signal path in the higher resistance electrode 204. These subsections can then be electrically connected through a bus 501 as seen in the micrograph image of FIG. 2. To make a smaller more efficient capacitor, reduction of the critical dimensions 206, 207 can be maximized or otherwise improved in order to increase the active area of the capacitor. In one or more exemplary embodiments, the length (L) 206 dimension can be fixed due to lithographic constraints, therefore by modifying the (W) 207 dimension and duplicating the structure as seen in FIG. 1, the active area can be significantly increased and the change in capacitance can be increased, such as to a 5 to 1 ratio. In one exemplary embodiment, a wide frequency of tuning can be enabled, and some of the applications of the embodiments can include but are not limited to low loss phase shifters for high electronically scanning antennas.

The reduction in thermally induced creep can occur due to the individual electrode subsections retaining and creating less stress than a single plate of similar area. Shear Stress can be defined as the shear force per unit area applied to a subsection of the top electrode 201. The smaller the area of shear, the smaller the stress applied to the device. As illustrated in FIG. 1, the "diamond" configuration depicts one embodiment of the invention in which the reduction of the original breaking of the electrode 201 increases the width to 4.25 times that of conventional capacitors. The reduction in resistance, leading to an increase in Q, can occur due to the length 206 of the signal path staying the same while the effective width 207 increases. The bus 501 is not shown in FIG. 1 for clarity purposes.

FIG. 1 depicts at least one apparatus and method of an exemplary embodiment of a capacitor 3D stack. In one exemplary embodiment, a multilayer BST composite can be formed by sputter blanket PARASCAN® from Paratek Inc. (35 target) on top of a Gennum Inc. 0.2 um Pt substrate. A Gold (Au) top electrode can be patterned using conventional semiconductor lithographic techniques and sputtered on top in order to create the interconnections between the top and bottom electrodes. The embodiment may also include at least one buffer layer. The wafer can be diced into approximate 4 of ½ by ½ after the PARASCAN® deposition.

Referring to FIG. 3, another exemplary embodiment of a capacitor 300 is shown. Capacitor 300, similar to the embodiment of FIG. 1, can include diamond-shaped top electrode subsections. Terminal A and Terminal B can be connected to select top electrode subsections, such as in alternating rows. This exemplary embodiment can increase the zero bias Q of the capacitor, which can be a voltage tunable capacitor. In this exemplary embodiment, capacitor 300 can reduce the series resistance of the bottom electrode by increasing the periphery length around each diamond-shaped top electrode. This is done by utilizing a nested array of diamond shapes for each of the subsections of the two connected top electrodes (e.g., first top electrode connected to terminal A and second top electrode connected to terminal B). A first group of top electrodes can be connected to the RF terminal A. A second group of the top electrode subsections can be connected by interconnect metal to the RF terminal B. A bottom electrode can be utilized for the connection between the first and second groups of top electrodes. The circular areas illustrated in FIG. 3 are vias 350 used to contact the top electrodes. It should be understood that the exemplary embodiments can also include other numbers of groups of top electrodes subsections. The terminals A, B can communicate input and/or output signals to the individual capacitors formed by the top and bottom electrodes. In one or more embodiments, the terminals A, B can have a comb shape with a terminal body 380 and a plurality of terminal fingers or connectors 385 extending therefrom, such as orthogonal from the terminal body. Circuit 400 representative of capacitor 300 is illustrated in FIG. 4 showing the configuration of the series and parallel connections of the individual capacitors formed through use of the first and second groups of top electrodes with the bottom electrode.

Figure 5:
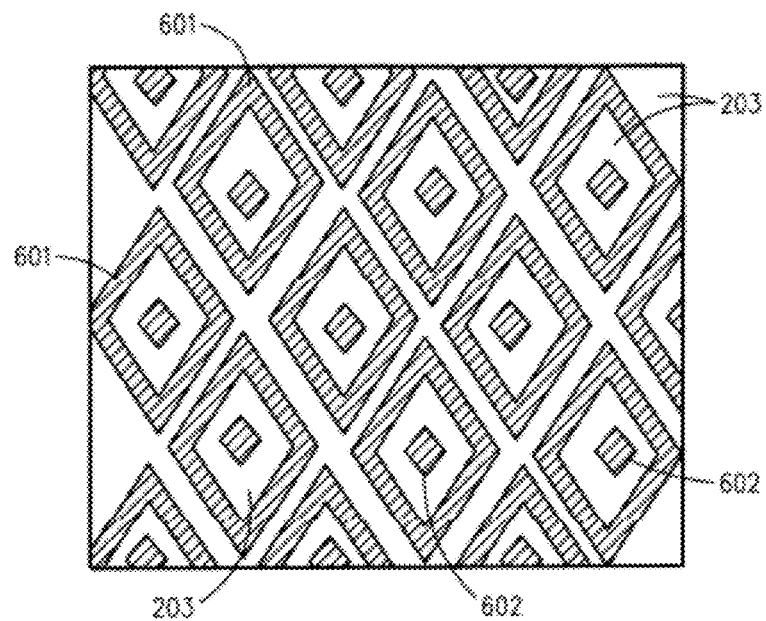
FIG. 5 depicts a top view of an exemplary embodiment of thin film diamond ring shaped electrode terminal with internal islands deposited terminals on tunable dielectric materials and a substrate.
Figure 6:
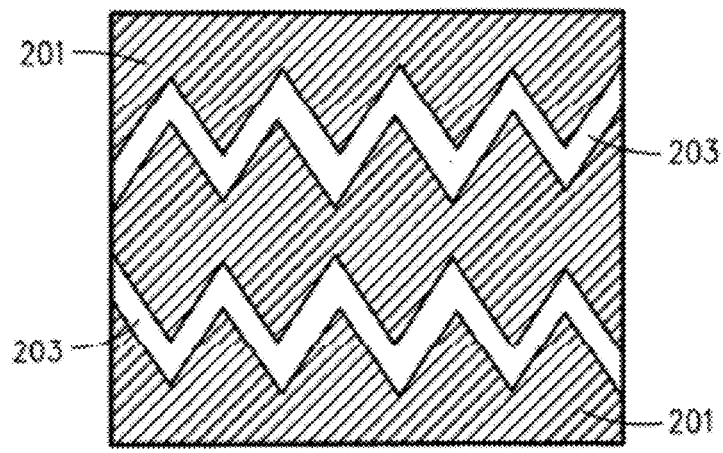
FIG. 6 depicts a top view of an exemplary embodiment of thin film terminals deposited to form a zigzag space on top of dielectric materials and a substrate.

The exemplary embodiments can include the electrodes being segmented or otherwise broken into many different shapes and arranged in many different ways to create the aforementioned benefit. FIG. 5 and FIG. 6 depict capacitors without the interconnection bus 501 for clarity. The bus 501 may be patterned and deposited by one skilled in the art in order to create parallel and/or series capacitors. Two embodiments are shown in FIG. 5 and FIG. 6. These embodiments include at least a solid bottom electrode, where the electrodes broken into subsections in FIG. 5 can include a "diamond ring" 601 with internal "islands" 602, which can maximize or otherwise increase the (W) 207 on both sides of the top electrode. For purposes of clarity, signal bus lines 501 to connect the subsections are not depicted but would connect the islands and rings to the outside circuitry, for example through gold wire bonds or studs.

Figure 7:
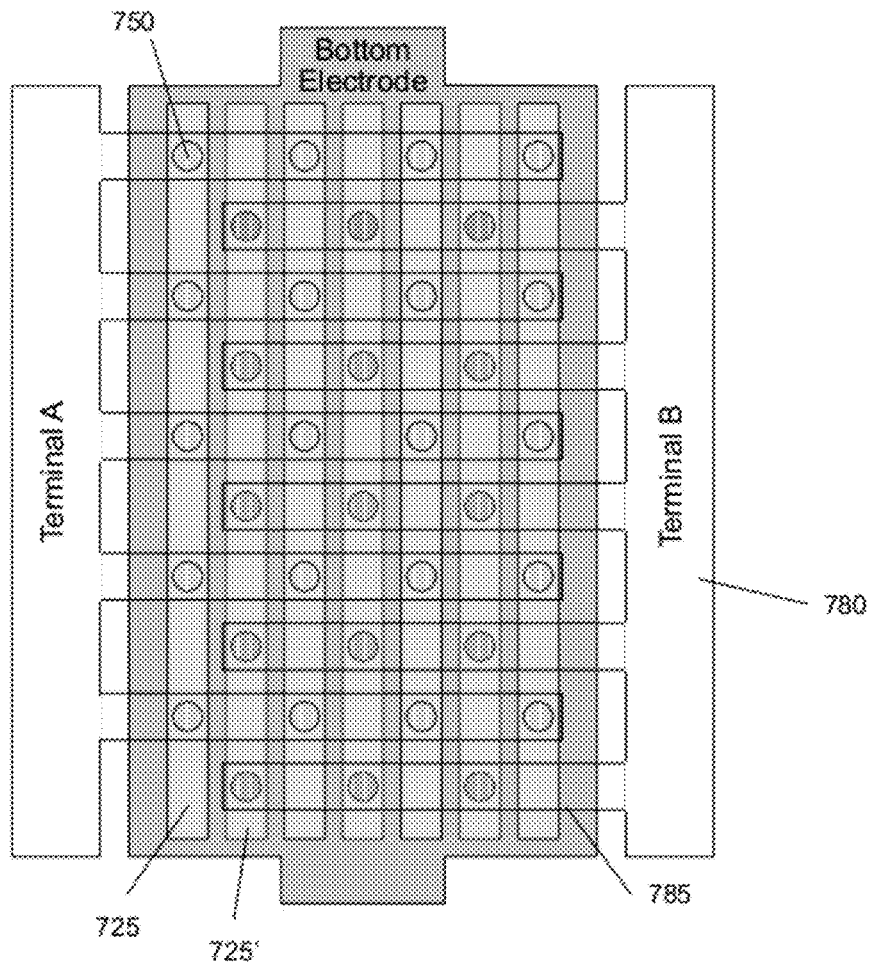
FIG. 7 depicts an exemplary embodiment of a segmented array capacitor.

Referring to FIG. 7, a segmented capacitor 700 is illustrated which can increase the zero bias Q. Capacitor 700 can reduce the series resistance of the bottom electrode by increasing the periphery length around each top or upper electrode. One means of increasing this periphery is to segment a very wide (e.g., in the transverse direction) capacitor and place the segments next to each other as shown to make an array of top electrodes that alternate in their connection to the RF terminals A and B. The exemplary embodiments can also include the capacitors be segmented in the horizontal direction or both at once. In this exemplary embodiment, surface currents in the bottom electrode can flow left and right from a given capacitor formed by way of dielectric material sandwiched with one of the rectangular top electrodes 750, thus reducing the effective resistance of this electrode by a factor of two.

Figure 8:
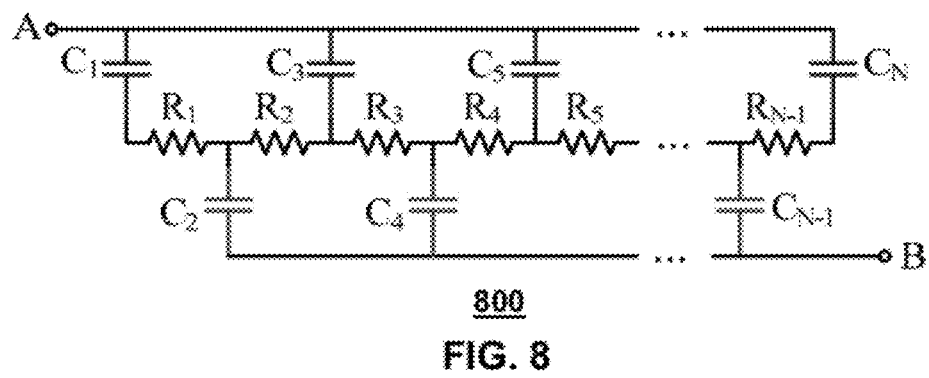
FIG. 8 depicts a circuit representative of the exemplary embodiment of FIG. 7.

A first group of the top electrodes 725 can be connected to the RF terminal A. A second group of the top electrodes 725' can be connected by interconnect metal to the RF terminal B. The first and second groups of top electrodes are formed in an alternating pattern, but the exemplary embodiment can include other patterns being utilized to group the top electrodes. The bottom electrode can provide the connection between the capacitors formed by the first group of top electrodes and the capacitors formed by the second group of top electrodes. The circular areas illustrated in FIG. 7 are vias 750 used to contact the top electrodes. The terminals A, B can communicate input and/or output signals to the individual capacitors formed by the top and bottom electrodes. In one or more embodiments, the terminals A, B can have a comb shape with a terminal body 780 and a plurality of terminal fingers or connectors 785 extending therefrom, such as orthogonal from the terminal body. It should be understood that the exemplary embodiments can also include other numbers of groups of top electrodes subsections. Circuit 800 representative of capacitor 700 is illustrated in FIG. 8 showing the configuration of the series and parallel connections of the individual capacitors formed through use of the first and second groups of top electrodes with the bottom electrode.

Figure 9:
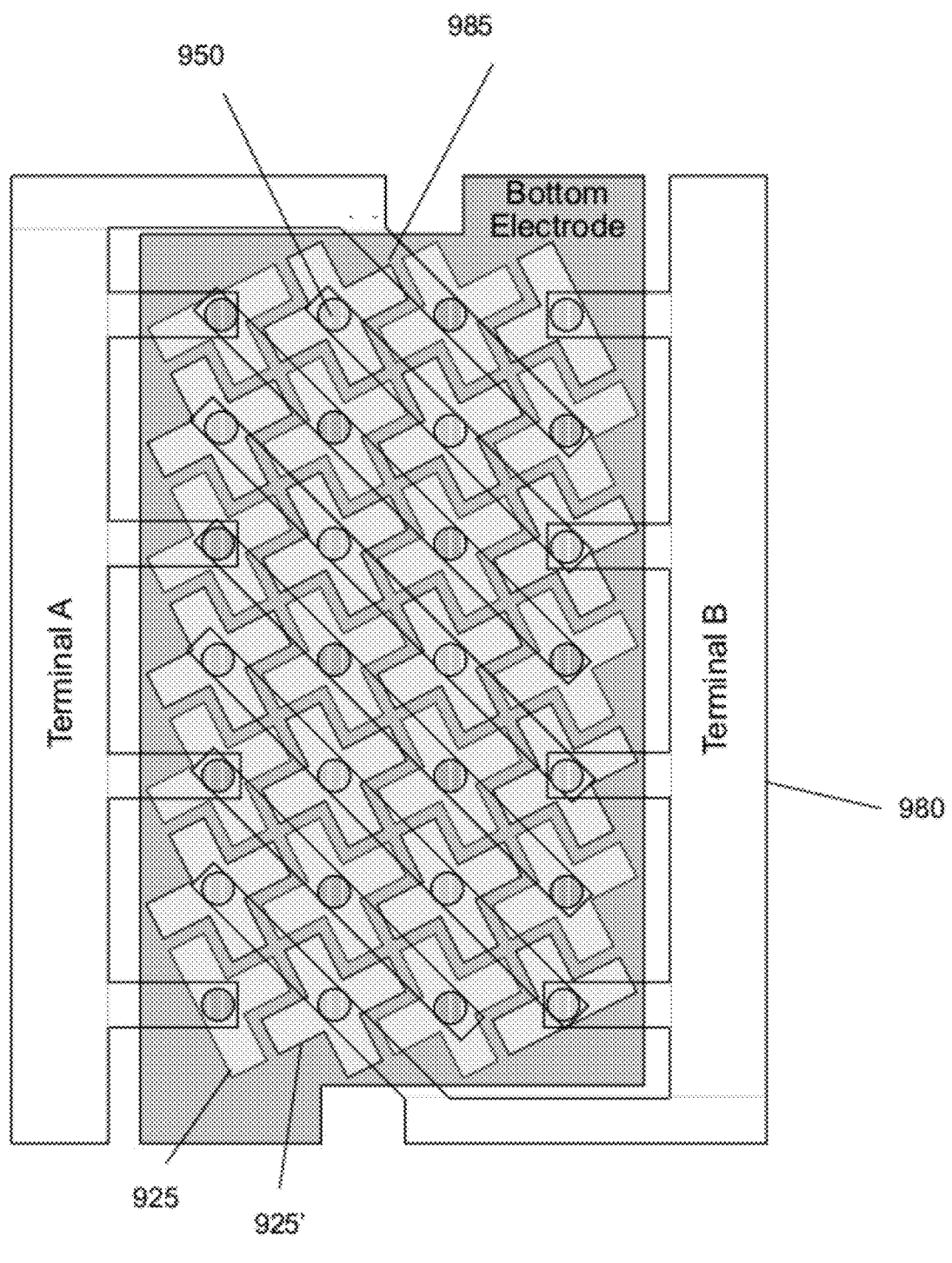
FIG. 9 depicts an exemplary embodiment of an array capacitor utilizing non-rectangular top electrodes.

Referring to FIG. 9, a segmented capacitor 900 is illustrated which can increase the zero bias Q. Capacitor 900 can reduce the series resistance of the bottom electrode by increasing the periphery length around each top or upper electrode. One means of increasing this periphery is use a nested array of crosses for the two top electrodes (e.g., a first group of cross-shaped electrodes 925 connected to terminal A and a second group of cross-shaped electrodes 925' connected to terminal B). The first and second groups of top electrodes are formed in an alternating pattern, but the exemplary embodiment can include other patterns being utilized to group the top electrodes. The bottom electrode can provide the connection between the capacitors formed by the first group of top electrodes and the capacitors formed by the second group of top electrodes. The circular areas illustrated in FIG. 9 are vias 950 used to contact the top electrodes. It should be understood that the exemplary embodiments can also include other numbers of groups of top electrodes subsections. Capacitor 900 can provide for series and parallel connections of the individual capacitors formed through use of the first and second groups of top electrodes with the bottom electrode. The terminals A, B can communicate input and/or output signals to the individual capacitors formed by the top and bottom electrodes. In one or more embodiments, the terminals A, B can have a terminal body 980 and a plurality of terminal fingers or connectors 985 extending therefrom. In one or more embodiments, a portion of one or more of the terminal connectors 985 can be orthogonal to the terminal body 980. In one or more embodiments, all or a portion of the terminal connectors 985 can be non-orthogonal to the terminal body 980 to facilitate connecting each of the first and second groups of top electrodes 925, 925' with terminals A, B, respectively.

In one or more embodiments, Capacitor 900 can utilize the cross-shaped top electrodes 925, 925' so as to maintain a consistent gap between each of the adjacent electrodes and/or maintain symmetry of the electrode subsection pattern. Other shapes can also be utilized for the crosses 925, 925' including other non-rectangular shapes. In one embodiment a combination of shapes can be utilizes such as the crosses and half-crosses depicted in FIG. 9. In one embodiment, the non-rectangular shapes used for the top electrode subsections can provide for an electrode subsections having at least one edge that is parallel with another edge of an adjacent top electrode subsection.

Figure 10:
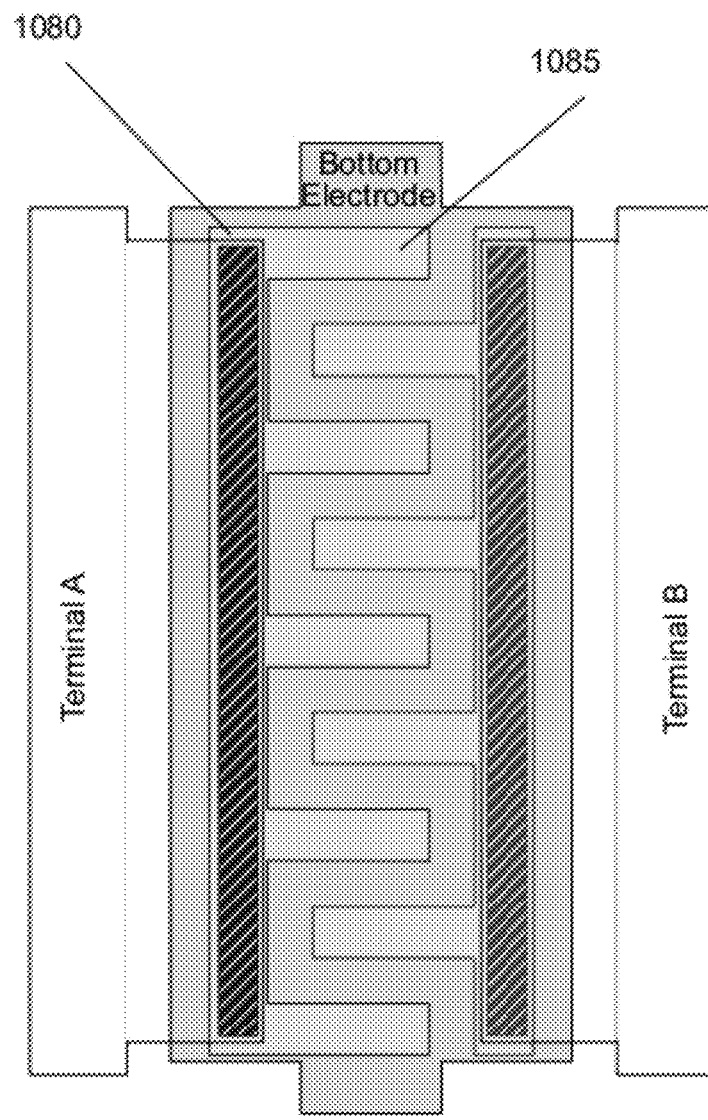
FIG. 10 depicts an exemplary embodiment of a capacitor utilizing comb-shaped top electrodes.

Referring to FIG. 10, a capacitor 1000 is illustrated which can increase the zero bias Q. Capacitor 1000 can reduce the series resistance of the bottom electrode by increasing the periphery length around each top or upper electrode. One means of increasing this periphery is to use a comb-shaped upper electrode pattern comprising a first comb-shaped electrode 1025 and a second-comb shaped electrode 1025'. The bottom electrode can provide the connection between the capacitors formed from the first and second comb-shaped top electrodes 1025, 1025'. In one or more embodiments, the comb-shaped electrodes 1025, 1025' can include an electrode body 1080 and a plurality of electrode fingers or connectors 1085 extending therefrom, such as orthogonal from the electrode body. The terminals A, B can communicate input and/or output signals to the individual capacitors formed by the top and bottom electrodes. In one embodiment, the terminals A, B can be connected with the electrodes 1025, 1025" along or in proximity to the corresponding electrode bodies 1080. It should be understood that the exemplary embodiments can also include other numbers of groups of top electrodes subsections. In one or more exemplary embodiments, capacitor 1000 can utilize the first and second comb-shaped electrodes 1025, 1025' including the orthogonal electrode fingers or connectors 1085 so as to maintain a consistent gap between each of the two top electrodes.

Figure 11:
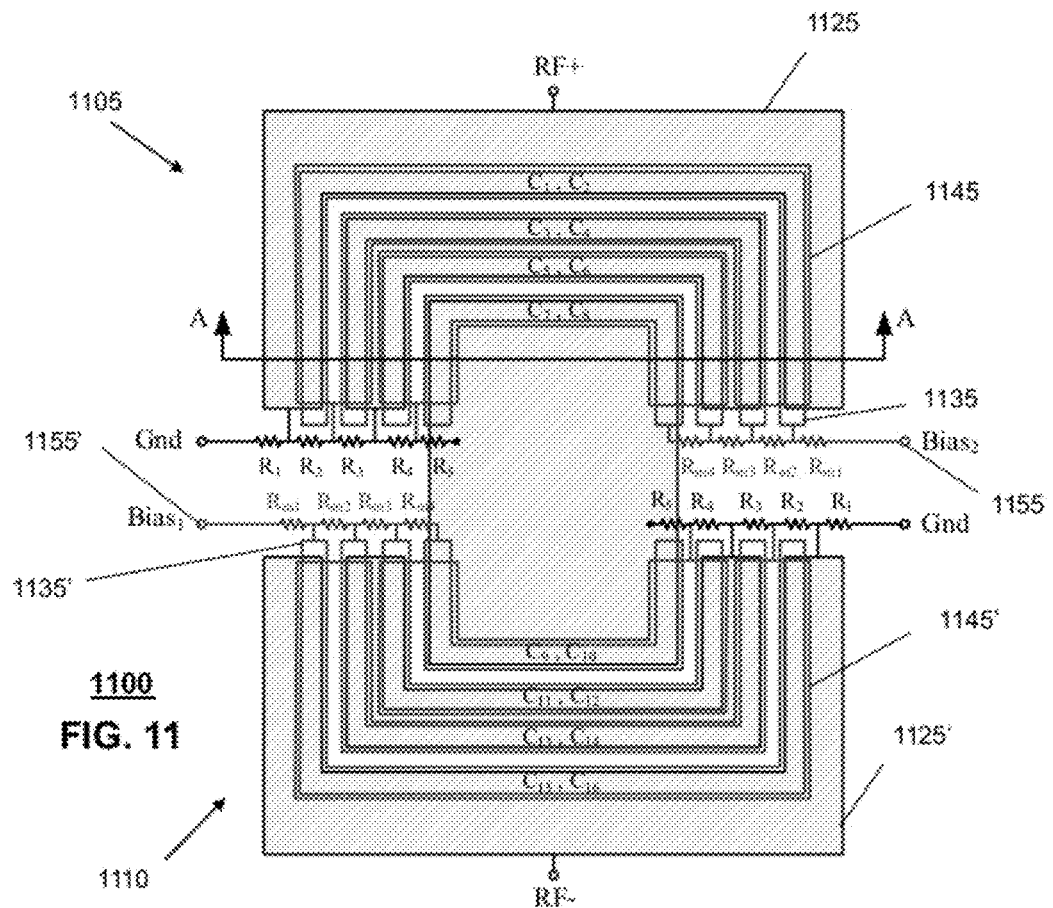
FIG. 11 depicts an exemplary embodiment of a nested ring capacitor.
Figure 12:
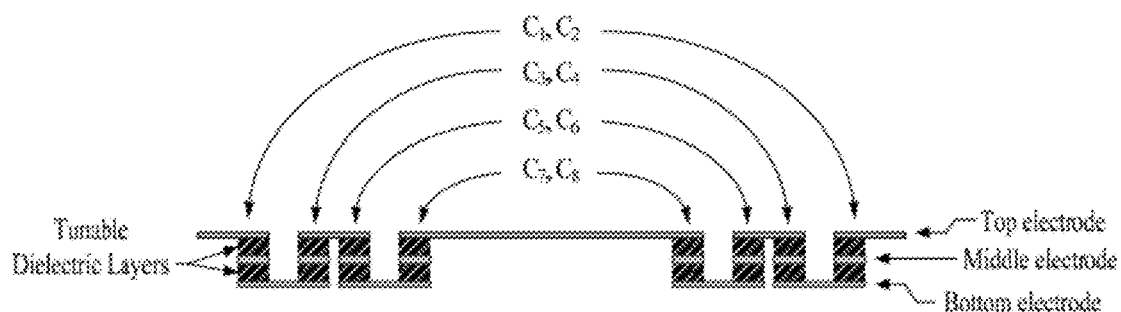
FIG. 12 depicts a cross-sectional view of the capacitor of FIG. 11 taken along line A-A of FIG. 11.

Referring to FIGS. 11 and 12, a capacitor 1100 is illustrated having a nested ring configuration. Capacitor 1100 can include a first capacitor portion or structure 1105 and a second capacitor portion or structure 1110. In one embodiment, the first and second capacitors portions can be symmetrical. First capacitor portion 1105 can include top electrodes 1125, middle electrodes 1135, bottom electrodes 1145, and biasing terminal 1155. A dielectric medium(s) 1165 (e.g., a tunable dielectric such as a BST material) can be used to separate the top, middle and bottom electrodes 1125, 1135, 1145 of the first capacitor portion 1105. Second capacitor portion 1110 can include top electrodes 1125', middle electrodes 1135', bottom electrodes 1145', and biasing terminal 1155'. A dielectric medium(s) (e.g., a tunable dielectric such as a BST material) can be used to separate the top, middle and bottom electrodes 1125', 1135', 1145' of the second capacitor portion 111.

Capacitor 1100 can increase the perimeter length of middle electrodes 1135, 1135' without increasing the area of the electrodes. In one embodiment, the broken concentric ring-like structure of capacitor 1100 can be used to enable a graded value of capacitance where the outer rings are higher capacitance values and the inner rings have lower capacitance values. With the appropriate resistive bias network, this arrangement of capacitors can permit lower time constants compared to a uniform distribution of capacitor values.

Capacitor 1100 is illustrated as a dual layer capacitor, meaning that two capacitors are stacked vertically to make each ring. However, the exemplary embodiments can include single layer or multiple layers with more than two stacked layers that utilize all or a portion of the features of capacitor 1100. Cross section A-A illustrates the construction of the capacitors as stacked capacitors using three metal layers.

It should be understood that each metal layer shown here may be a combination of metals. For instance, Pt may be used to contact the tunable dielectric layers (e.g., PARASCAN®) and/or TiW may be used next to the Pt for adhesion purposes. Other metals with higher electrical or thermal conductivity may be employed to lower the electrical and/or thermal resistance of each electrode.

Capacitor 1100 can provide a symmetrical biasing network. Capacitor 1100 can achieve low charging times or low time constants for all capacitors in the string. Capacitor 1100 is in essence a splitting of the bias network into two halves, which may be symmetric as shown (or in one or more embodiments may be asymmetrical), to enable charging current to be injected equally along both sides of the capacitor string. To facilitate equalizing the charging times so as to achieve the shortest overall transient response, the capacitor values can be graded in the following manner such that the largest capacitors are found near the ends of the string:

$C_1 \cong C_2 > C_3 \cong C_4 > C_5 \cong C_6 > C_7 \cong C_8$
$C_9 \cong C_{10} < C_{11} \cong C_{12} < C_{13} \cong C_{14} < C_{15} \cong C_{16}$ In one or more exemplary embodiments, the bias resistors $R_m$ may be graded so as to have the largest resistor near the bias terminals:

$R_{m1} > R_{m2} > R_{m3} > R_{m4}$

Figure 13:
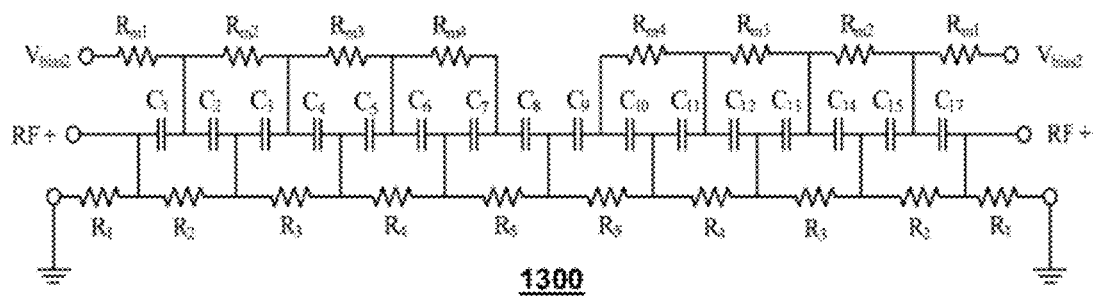
FIG. 13 depicts a circuit representative of the exemplary embodiment of FIG. 10.
Figure 14:
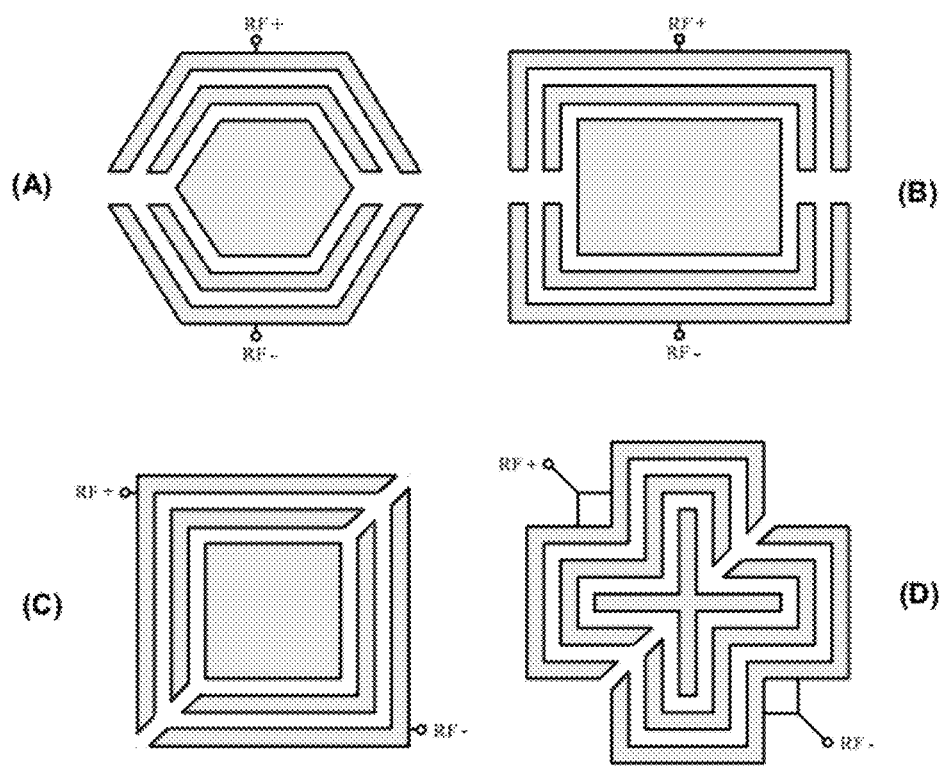
FIGS. 14A-D depict other exemplary embodiments of nested ring capacitors.

This bias resistor grading can also be done to facilitate equalizing the charging times across capacitors in the string. Circuit 1300 representative of capacitor 1100 is illustrated in FIG. 13. Additionally, while the exemplary embodiment of FIG. 11 describes two bias terminals, it is also contemplated that any number of bias terminals can be utilized such as a single bias terminal or three or more bias terminals. The nested configuration can be adjusted based on the number of biasing terminals. Additionally, any number of capacitor portions can be utilized, including using four portions with four bias terminals, where the four portions can share a center top electrode.

One or more exemplary embodiments can utilize the nested ring capacitor configuration of FIG. 11, but with different shapes for the electrodes. Referring to FIGS. 14A-14D, the four capacitor designs represent top electrode metal patterns built as nested rings. The exemplary embodiments can include other polygonal shapes which may or may not provide a symmetrical configuration. Bias resistors are omitted for clarity in FIGS. 14A-14D, but they can be located in the vicinity of the gaps in the outer rings.

Figure 15:
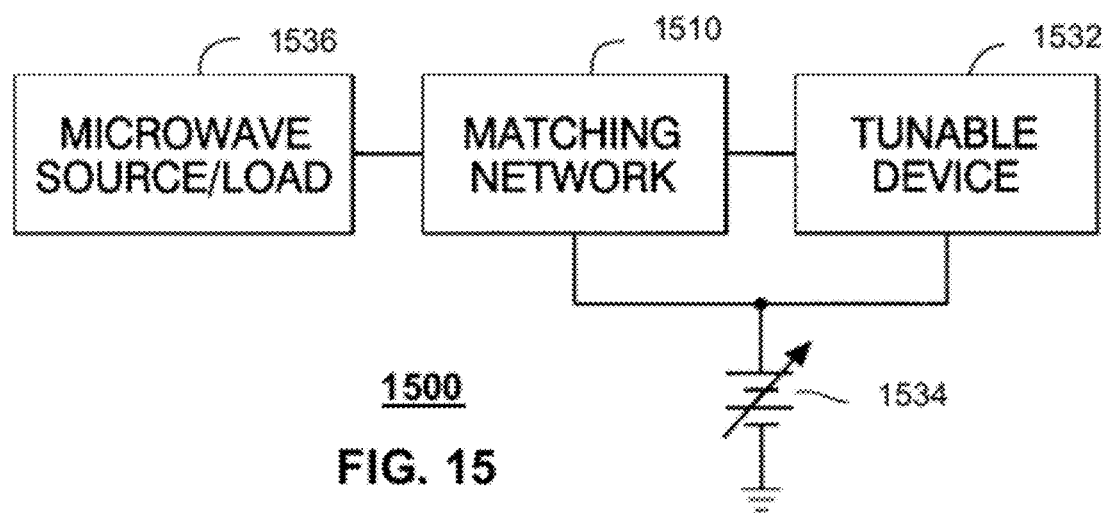
FIG. 15 depicts a system 1500 that can utilize one or more of the exemplary embodiments of the capacitors of FIGS. 1-14.

FIG. 15 is a block diagram of a system 1500 having a matching network 1510 that can utilize one or more of the exemplary capacitors or other components described herein. The matching network 1510 can be coupled to a tunable microwave device 1532. The tunable microwave device 1532 could be one of many devices which have varying input/output characteristic impedances such as tunable phase shifters, delay lines, filters, etc. In one embodiment, the adjustable external DC voltage source 1534 can be used to supply bias voltage to the matching network 1510 and the tunable microwave device 1532 in tandem. As the voltage supplied by the external DC voltage source 1534 changes, the characteristic input/output impedance of the tunable dielectric device may also change. At the same time, the impedance characteristics of the matching network 1510 can change to maximize, improve or otherwise adjust power transfer from/to the microwave source/load 1536 to/from the tunable microwave device 1532. In one embodiment, the tunable microwave device 1532 and the matching network 1510 can be controlled by two different external DC voltage sources. The exemplary embodiments can be utilized in other circuits that may or may not include matching networks.

In one exemplary method, an electrode can be broken into subsections with signal bus lines connecting the subsections and a solid electrode to improve Q. The method may further comprise distributing the signal across the capacitor area by the broken electrode and thereby increasing the effective width of a signal path through the solid electrode. The capacitor may be of various forms including a planar integrated capacitor or a discrete ceramic capacitor. The method may still further comprise adapting the solid electrode and the broken electrode to reduce the mechanical stresses generated in the metals and dielectric films of the capacitor. For example, the capacitor can be utilized in a pair of series capacitors where the subsections are arranged in such a manner that it increases the effective width of the signal path in the solid electrode. In one exemplary embodiment, a series network of voltage tunable dielectric capacitors can be provided, such as according to the steps and structures described herein, which are all, or a portion thereof, tuned using a common tuning voltage.

In one exemplary embodiment, a capacitor electrode structure is provided that allows for the creation of very high "Q" (e.g., low resistance) capacitors. For instance, one electrode can be made from a higher resistance metal than the opposite electrode, such as in planar integrated capacitors, as well as discrete ceramic capacitors. As an example, the electrodes can be broken into subsections, with signal bus lines connected to the subsections and/or to a solid electrode. The broken electrode preferably has the lower resistance material of the two. The broken electrode may distribute the signal across the capacitor area and, through proper arrangement, increase the effective width of the signal path through the higher resistance solid electrode. The signal busses may bring in and take out the signal. Voltage tunable dielectric material can be utilized between the electrodes.

One or more of the exemplary embodiments can include a first or bottom electrode(s), such as platinum, patterned and deposited into a substrate. A dielectric material, such as a thin film coating of a BST type material can be deposited on top of the bottom electrode, such as according to one or more of the exemplary configurations described above. A top or second electrode(s) can be deposited on top of the BST film.

Interconnects, vias and the like can be utilized with the exemplary embodiments, including being deposited over a portion of the thin film structure, to provide attachment to other components, such as a microwave circuit and/or to provide an electrical path to at least one of the electrodes. Various materials including gold, aluminum and silver can be provided using various techniques including sputter and depositing to form some of the components of one or more of the exemplary embodiments, such as the electrode(s), the bus and so forth. In one embodiment, a polymer encapsulation can be deposited to provide protection from ambient conditions and/or as a humidity barrier. In one embodiment, multiple layers of dielectric materials (e.g., BST thin films) and/or electrodes can be deposited or otherwise formed to create an elaborate 3D structure of a multiple layer capacitor stack.

One or more of the exemplary embodiments of the capacitor configurations can be utilized in various systems. For instance, wireless communications is a rapidly growing segment of the communications industry, with the potential to provide high-speed high-quality information exchange between portable devices located anywhere in the world. Potential applications enabled by one or more of the exemplary embodiments include multimedia internet-enabled cell phones, smart homes, appliances, automated highway systems, distance learning, and autonomous sensor networks, just to name a few.

One or more of the exemplary embodiments can be used to enable low loss devices that can be used at higher frequency ranges. One or more of the exemplary embodiments can utilize relatively low capacitance varactors that can operate at temperatures above those necessary for superconduction and at bias voltages less than those required for existing planar varactor structures, while maintaining high tunability and high Q factors. Even though these materials may work in their paraelectric phase above the Curie temperature, they are conveniently called "ferroelectric" because they exhibit spontaneous polarization at temperatures below the Curie temperature. Tunable ferroelectric materials including barium-strontium titanate $Ba_xSr_{1-x}TiO_3$ (BST) or BST composites have been the subject of several patents. Dielectric materials including BST are disclosed by Sengupta, et al. in U.S. Pat. No. 5,312,790; U.S. Pat. No. 5,427,988; U.S. Pat. No. 5,486,491; U.S. Pat. No. 5,846,893; U.S. Pat. No. 5,635,434; U.S. Pat. No. 5,830,591; U.S. Pat. No. 5,766,697; U.S. Pat. No. 5,693,429; U.S. Pat. No. 6,074,971; U.S. Pat. No. 6,801,104 B2 and U.S. Pat. No. 5,635,433. The disclosures of each of these patents are hereby incorporated by reference in their entirety. The dielectric constant of these materials can be varied by varying the strength of an electric field to which the materials are subjected. These materials allow for thin-film ferroelectric composites of low overall dielectric constant that takes advantage of the high tunability and at the same time having high dielectric constants. BST thin films can be used with one or more of the exemplary embodiments due to their high dielectric constant, high tunability, low loss, and fast switching speed.

One or more of the exemplary embodiments can include the use of non-tunable dielectric material alone or in combination with other capacitors that utilize tunable dielectric material. The configuration of tunable and non-tunable capacitors formed by the exemplary embodiments can vary. The exemplary embodiments can also include the use of different dielectric materials by different individual capacitors formed by the segmented electrodes and the solid electrode, including a plurality of different tunable dielectric materials and/or a plurality of non-tunable dielectric materials forming individual capacitors that are in parallel and/or series and with each other.

Quality factor, resonance frequency and breakdown voltage are can be important factors for determining when thin film capacitor can be utilized. High-frequency device losses consist of material-related losses in the film and at the electrode-film interface, as well as the resistive losses in the electrodes. Thermal strain can occur on the interface between the ferroelectric thin film and the metal electrode due to the creation of oxide films and crystalline microstructure. This interface is generally the cause of losses at high frequencies and premature breakdown at low voltages. Also, the designs on current devices are limited by traditional design guidelines that create resistive losses due to design constraints.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense. Components and/or functionality described with respect to one or more embodiments can be interchangeable or otherwise used with components and/or functionality described with respect to another embodiment. Similarly, steps of the methods and processes described herein can be performed sequentially, simultaneously, overlapping and/or according to other timing.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An apparatus, comprising:
   a first solid electrode;
   a second electrode separated into subsections; and
   a dielectric medium separating the subsections from the first solid electrode,
   wherein the subsections of the second electrode comprise a first group of subsections and a second group of subsections, wherein the first group of subsections is separated into two or more first subsections, and wherein the second group of subsections is separated into two or more second subsections,
   wherein the first group of subsections and the first solid electrode form a first group of capacitors, wherein the first group of subsections are arranged in a nested array configuration,
   wherein the second group of subsections and the first solid electrode form a second group of capacitors, wherein the second group of subsections are arranged in a nested array configuration,
   wherein each capacitor of the first group of capacitors is in parallel,
   wherein each capacitor of the second group of capacitors is in parallel,
   wherein the first group of capacitors is in series with the second group of capacitors,
   wherein the first group of subsections is connectable with a first terminal for receiving an input signal, and
   wherein the second group of subsections is connectable with a second terminal for providing an output signal.

2. The apparatus of claim 1, wherein at least a portion of the subsections has a cross shape.

3. The apparatus of claim 1, wherein the subsections have a rectangular shape and are parallel to each other, and wherein the first and second groups of capacitors are formed in an alternating pattern.

4. The apparatus of claim 1, wherein the first and second terminals have a comb shape with a terminal body and terminal connectors extending from the terminal body, and wherein the terminal connectors are connected with the subsections of the second electrode using metal vias.

5. The apparatus of claim 4, wherein at least a portion of the terminal connectors is non-orthogonal to the terminal body.

6. The apparatus of claim 1, wherein the subsections have a diamond shape, and wherein each adjacent subsection is separated by an equal gap.

7. The apparatus of claim 1, wherein the second electrode separated into the subsections has a lower resistance than the first solid electrode.

8. The apparatus of claim 1, wherein the dielectric medium is a tunable dielectric medium comprising barium-strontium titanate.

9. An apparatus, comprising:
   a first solid electrode separated into first subsections, wherein the first subsections are arranged in a nested array configuration;
   a second electrode separated into second subsections, wherein the second subsections are arranged in a nested array configuration; and
   a dielectric medium separating the first subsections from the second subsections,
   wherein the first electrode is connectable with a first terminal for receiving an input signal,
   wherein the second electrode is connectable with a second terminal for providing an output signal, and
   wherein at least a portion of the first subsections and the second subsections comprise a cross shape.

10. The apparatus of claim 9, wherein at least a portion the first subsections and second subsections have a rectangular shape and are parallel to each other.

11. The apparatus of claim 10, wherein the second subsections comprise a first group of subsections and a second group of subsections, wherein the first group of subsections is separated into two or more first subsections, and wherein the second group of subsections is separated into two or more second subsections, and
    wherein the first group of subsections and the first solid electrode form a first group of capacitors, wherein the second group of subsections and the first solid electrode form a second group of capacitors, and wherein the first and second groups of capacitors are formed in an alternating pattern.

12. The apparatus of claim 11, wherein the first group of capacitors is in series with the second group of capacitors.

13. The apparatus of claim 9, wherein the first and second terminals have a comb shape with a terminal body and terminal connectors extending from the terminal body, and wherein the terminal connectors are connected with the subsections of the second electrode using metal vias.

14. The apparatus of claim 13, wherein at least a portion of the first subsections and the second subsections have a diamond shape, and
    wherein at least a portion of the terminal connectors is non-orthogonal to the terminal body.

* * * * *